(12) United States Patent
Lim et al.

(10) Patent No.: US 7,253,097 B2
(45) Date of Patent: Aug. 7, 2007

(54) INTEGRATED CIRCUIT SYSTEM USING DUAL DAMASCENE PROCESS

(75) Inventors: Yeow Kheng Lim, Singapore (SG); Chim Seng Seet, Singapore (SG); Tae Jong Lee, Singapore (SG); Liang-Choo Hsia, Singapore (SG); Kin Leong Pey, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 11/160,624

(22) Filed: Jun. 30, 2005

(65) Prior Publication Data

US 2007/0001303 A1 Jan. 4, 2007

(51) Int. Cl.
*H01L 21/4763* (2006.01)
(52) U.S. Cl. .................. 438/627; 438/626; 438/633; 438/634; 438/639; 257/E21.579
(58) Field of Classification Search .......... 438/626, 438/627, 633, 639, 634; 257/E21.579
See application file for complete search history.

(56) References Cited

U.S. PATENT DOCUMENTS

| | | | |
|---|---|---|---|
| 6,080,669 A * | 6/2000 | Iacoponi et al. | 438/672 |
| 6,410,426 B1 * | 6/2002 | Xing et al. | 438/638 |
| 2002/0096768 A1 * | 7/2002 | Joshi | 257/750 |
| 2002/0127876 A1 * | 9/2002 | Eissa et al. | 438/778 |
| 2003/0077897 A1 * | 4/2003 | Tsai et al. | 438/633 |
| 2004/0110369 A1 * | 6/2004 | Jiang et al. | 438/637 |
| 2005/0051900 A1 * | 3/2005 | Liu et al. | 257/757 |
| 2005/0124153 A1 * | 6/2005 | Cohen | 438/634 |
| 2005/0153544 A1 * | 7/2005 | Suh et al. | 438/643 |
| 2005/0239278 A1 * | 10/2005 | Li et al. | 438/618 |
| 2005/0255690 A1 * | 11/2005 | Chen et al. | 438/627 |
| 2005/0260851 A1 * | 11/2005 | Huang et al. | 438/643 |
| 2006/0024951 A1 * | 2/2006 | Schuehrer et al. | 438/627 |

\* cited by examiner

*Primary Examiner*—George R. Fourson
*Assistant Examiner*—John M. Parker
(74) *Attorney, Agent, or Firm*—Mikio Ishimaru

(57) ABSTRACT

An integrated circuit system includes providing a semiconductor substrate having a semiconductor device provided thereon. A first dielectric layer is formed over the semiconductor substrate, and a first conductor core is formed in the first dielectric layer. A stop layer is formed over the first conductor core. A second dielectric layer is formed over the stop layer. A channel and a via are formed in the second dielectric layer. The channel and the via in the second dielectric layer are wet cleaned. A barrier metal layer is deposited to line the channel and the via in the second dielectric layer. The barrier metal layer is selectively etched from the bottom of the via in the dielectric layer, and a second conductor core is formed over the barrier metal layer to fill the second channel and the via to connect the second conductor core to the first conductor core.

20 Claims, 3 Drawing Sheets

INTEGRATED CIRCUIT SYSTEM USING DUAL DAMASCENE PROCESS

TECHNICAL FIELD

The present invention relates generally to semiconductor technology and more specifically to dual damascene interconnects in semiconductors.

BACKGROUND ART

In the manufacture of integrated circuits, after the individual devices such as the transistors have been fabricated in and on a semiconductor substrate or wafer, they must be connected, or "wired", together to perform the desired circuit functions. This interconnection process is generally called "metallization" and is performed using a number of different photolithographic, deposition, and removal processes to create contacts to the transistors, wire/channels to the contacts, and vias interconnecting the channels where there are more than one level of channels.

There are a number of different metalization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed over the first channel stop layer. Where the first channel dielectric layer is of an oxide material, such as silicon oxide ($SiO_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited on the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide. This diffusion can result in a conductive buildup and cause short circuits in the integrated circuits. To prevent diffusion, a diffusion barrier is deposited on the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is electroplated on the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first channel dielectric layer so the materials and layers are coplanar with the dielectric layer. The CMP process leaves the first conductor "inlaid" in the first channel dielectric layer to form the first channels. When a thin dielectric layer is placed over the first channels as a final layer, it is called a "capping" layer and the single damascene process is completed. When the layer is processed further for placement of additional channels over it, the layer is a via stop layer.

In another technique called the "dual damascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed over the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped. An etch stop layer between the via and the second channel opening may be optional depending upon the manufacturing process being used.

A second channel dielectric layer is formed over the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited on the barrier layer and lines the barrier layer in the second channel openings and the vias.

A second conductor material is electroplated on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which are very difficult to etch.

From a reliability perspective, one of the most critical areas in a Cu dual-damascene (DD) structure is the bottom of the vias where two metal levels meet. In the typical manufacturing sequence, after the via is opened to the underlying metal conductor, it will undergo a wet clean process to remove polymers and other impurities generated during etch. Thereafter, it will undergo a degas process, such as an argon (Ar) sputter and hydrogen ($H_2$) reactive pre-clean prior to formation of the barrier metal, Cu seed deposition and Cu plating. These pre-clean processes are designed to remove Cu oxide and etch residues (if any) from the via bottom. Insufficient pre-clean will result in increased via resistance, reduced yield and degraded interconnect reliability.

On the other hand, an aggressive sputter pre-clean process leads to loss of the critical dimension (CD) of the metal conductor, and contaminates the via sidewalls leading to poor adhesion between the barrier metal layer and the inter-metal dielectric (IMD) layer, and forms voids at the bottom corners of the via. Also, reactive pre-clean processes have limitations such as their reactivity with a wide range of contaminants such as carbon, fluorine, Cu oxide and etch residues which all have very different etch chemistries. It also reacts with constituents of a low-k IMD layer leading to loss of CD and increased k value. Thus, the extendibility of existing sputter and reactive pre-clean processes for future interconnect applications is questionable.

One proposed solution, referred to as a barrier first approach, skips the pre-clean processes by selectively removing the deposited barrier metal and contaminants only from the via bottom. However, these selectively removed contaminants are re-deposited on the barrier metal at the via sidewalls prior to deposition of the seed layer and electroplating of the metal, which poses some of the same reliability concerns.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system that includes providing a semiconductor substrate having a semiconductor device provided thereon. A first dielectric layer is formed over the semiconductor substrate, and a first conductor core is formed in the first dielectric layer. A stop layer is formed over the first conductor core. A second dielectric layer is formed over the stop layer. A channel and a via are formed in the second dielectric layer. The channel and the via in the second dielectric layer are wet cleaned. A barrier metal layer is deposited to line the channel and the via in the second dielectric layer. The barrier metal layer is selectively etched from the bottom of the via in the dielectric layer, and a second conductor core is formed over the barrier metal layer to fill the second channel and the via to connect the second conductor core to the first conductor core.

The present invention provides for an integrated circuit system in which wet cleaning the channel and the via is performed while the via is closed to contact with the first conductor core, and the barrier metal layer and the stop layer are etched from the bottom of the via after wet cleaning the channel and the via thereby reducing contaminants in the via between conductor cores.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure. The term "forming" as used herein includes processes such as depositing, growing, building, chemically combining, or other processes for forming layers, films, and structures.

Figure 1:
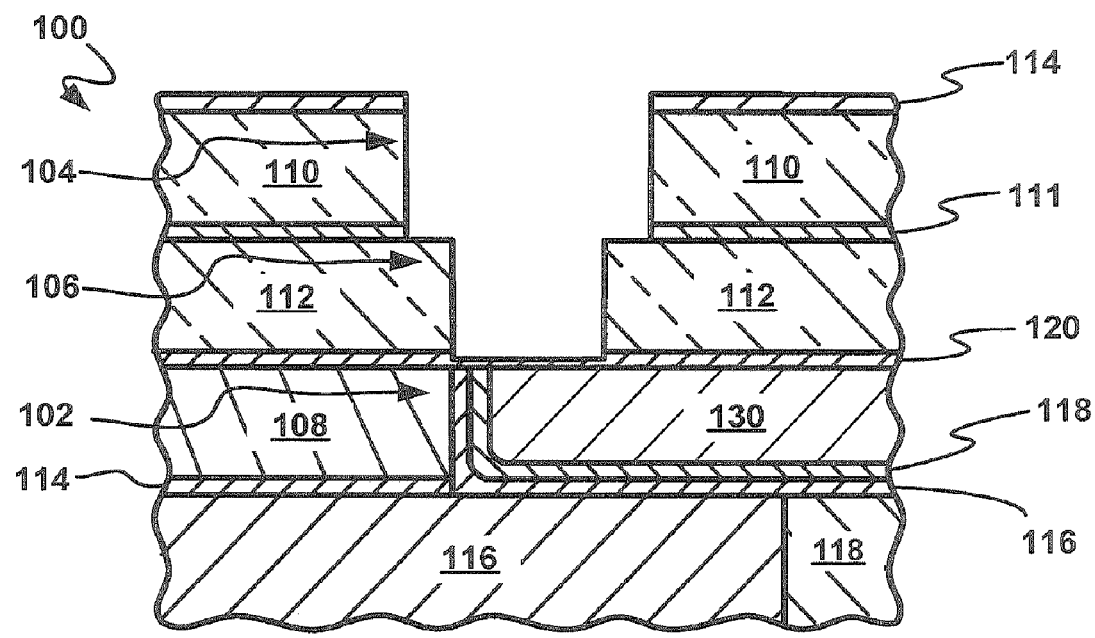
FIG. 1 is a cross-sectional view of a semiconductor system at an intermediate stage of manufacture in accordance with the present invention.

Referring now to FIG. 1, therein is shown a cross-sectional view of a semiconductor system 100 at an intermediate stage of manufacture in accordance with the present invention. The semiconductor system 100 has first and second channels 102 and 104 connected by a via 106. The first and second channels 102 and 104 are respectively disposed in first and second dielectric layers 108 and 110. The via 106 is a part of the second channel 104 and is disposed in a via dielectric layer 112.

A portion of the first channel 102 is disposed in a first channel stop layer 114 and is on a device dielectric layer 116. Generally, metal contacts (not shown) are formed in the device dielectric layer 116 to connect to an operative semiconductor device (not shown). This is represented by the contact of the first channel 102 with a semiconductor device gate 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 111, the second channel dielectric layer 110, and a next channel stop layer 114.

The first channel 102 includes a barrier layer 116 and a seed layer 118 around a conductor core 130. The second channel 104 and the via 106 are formed using a dual damascene etching process to etch the next channel stop layer 114, the second channel dielectric layer 110, the second channel stop layer 111, and the via dielectric layer 112. The second channel and the via 106 undergo a wet clean process to remove contaminants and residue left by the etching process. The bottom of the via 106 remains closed to the first conductor core during the wet clean process.

Figure 2:
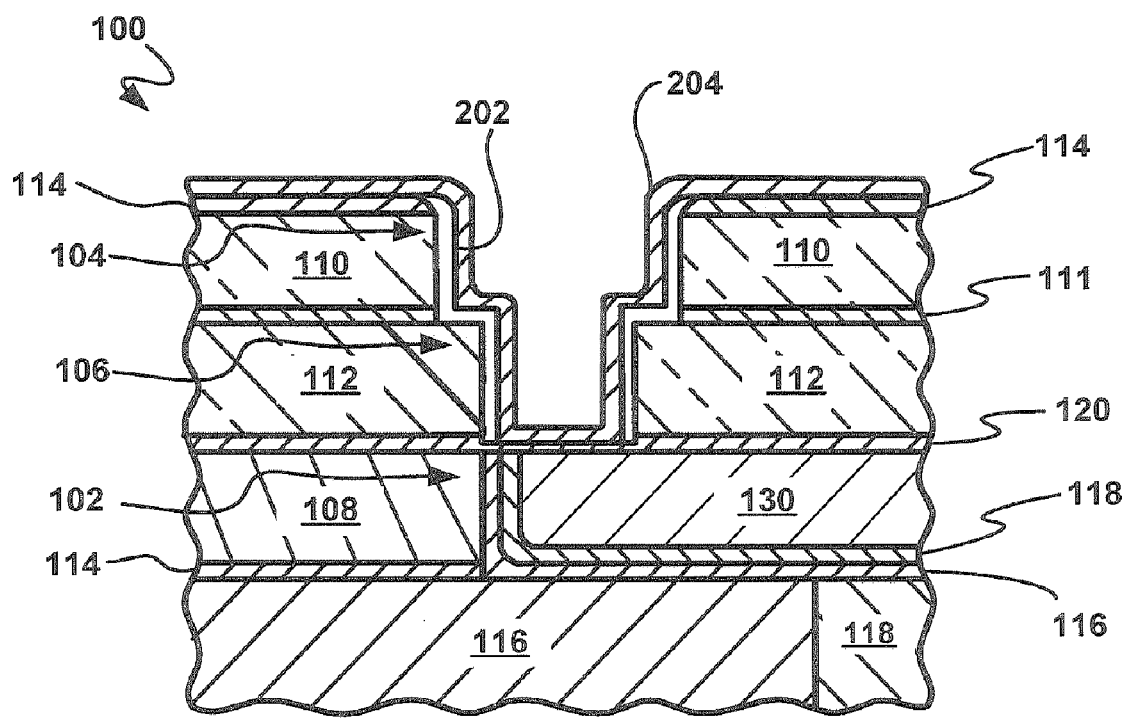
FIG. 2 is the structure of FIG. 1 after deposition of a barrier metal layer.

Referring now to FIG. 2, therein is shown the structure of FIG. 1 after further processing in accordance with the present invention. A pore sealant 202 is selectively applied to the sidewalls of the second channel 104 and the via 106. A barrier metal layer 204 is formed, such as by deposition, on the surfaces of the via 106, the second channel 104, and the upper surface of the second channel dielectric layer.

Figure 3:
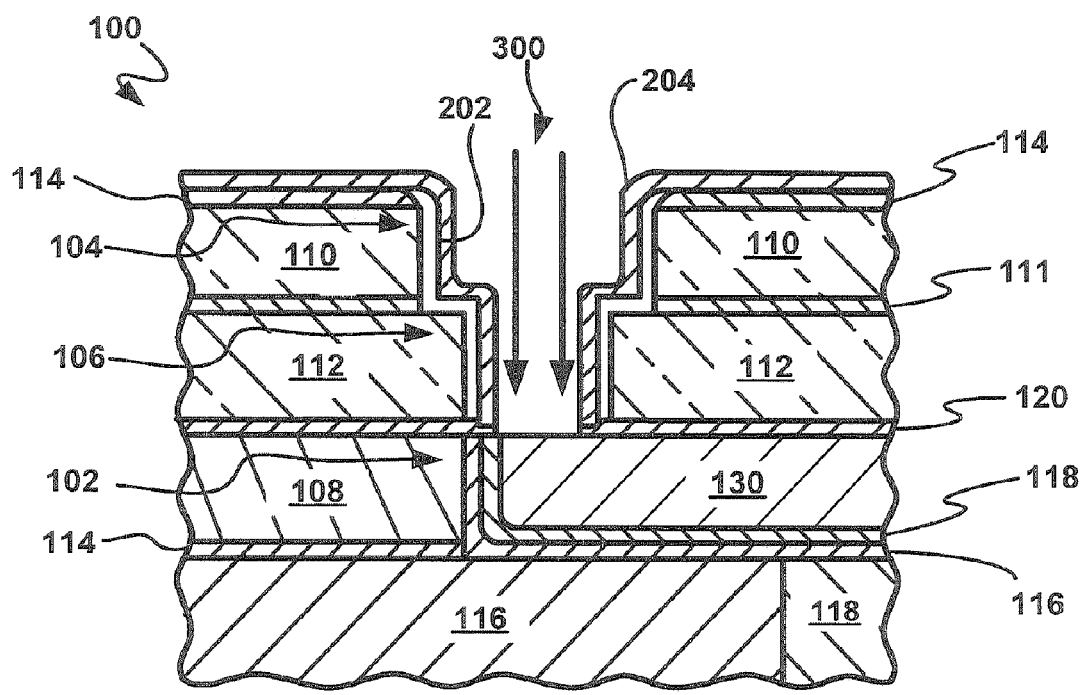
FIG. 3 is the structure of FIG. 2 after selectively removing the barrier metal layer and the second channel dielectric layer from the bottom of the via.

Referring now to FIG. 3, therein is shown the structure of FIG. 2 after selectively removing the barrier metal layer 204 and the second channel dielectric layer 110 from the bottom of the via 106. The barrier metal layer 204 and the via stop layer 120 are removed from the bottom of the via 106 using a selective etching process 300. Since the bottom of the via 106 is opened to the first conductor core at this stage minimum contaminants are re-deposited on the barrier metal layer 204 at the via sidewalls thereby reducing reliability concerns due to the presence of such contaminants.

Figure 4:
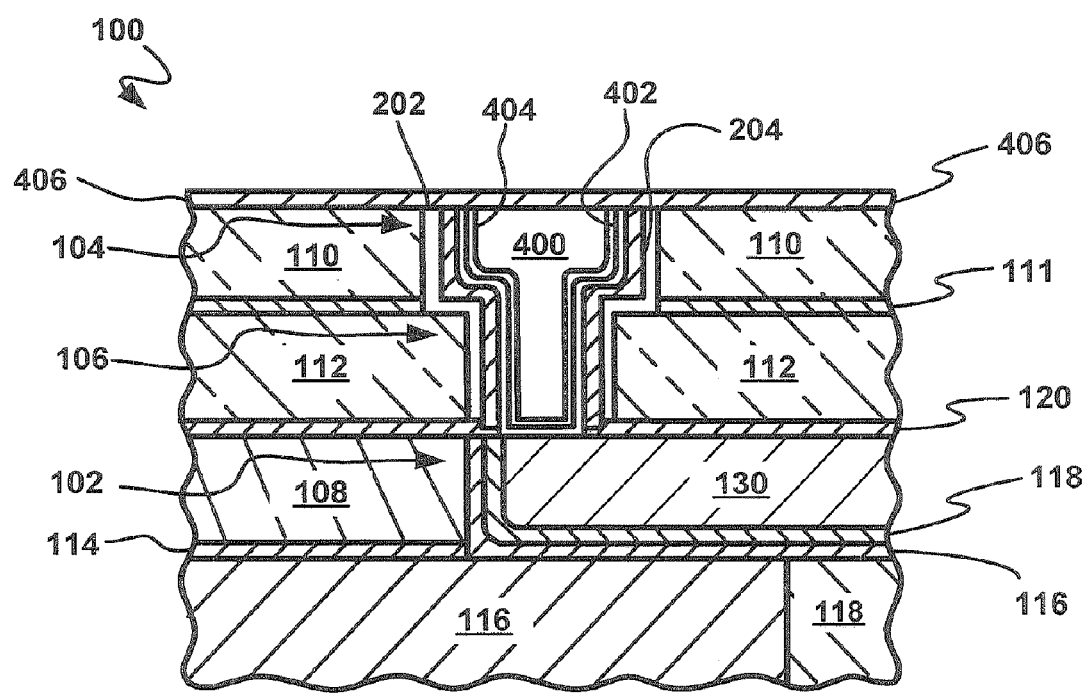
FIG. 4 is the structure of FIG. 3 after formation of a second conductor core in the second channel and the via.

Referring now to FIG. 4, therein is shown the structure of FIG. 3 after formation of a second conductor core 400 in the second channel 104 and the via 106. A barrier metal flash layer 402 is formed, such as by deposition, in the second channel 104 and the via 106. A metal seed layer 404 is formed, typically by a deposition process, over the barrier metal flash 402, and the conductor metal, such as Cu, is formed in the second channel and the via typically using an electrochemical plating (ECP) process to form the second conductor core 400.

A chemical mechanical planarization (CMP) process is performed to level the upper surface of the structure, and the upper surface is capped with a cap dielectric layer 406. Additional dielectric layers and conductor cores may be formed over the second conductor core as required in a particular integrated circuit design.

Figure 5:
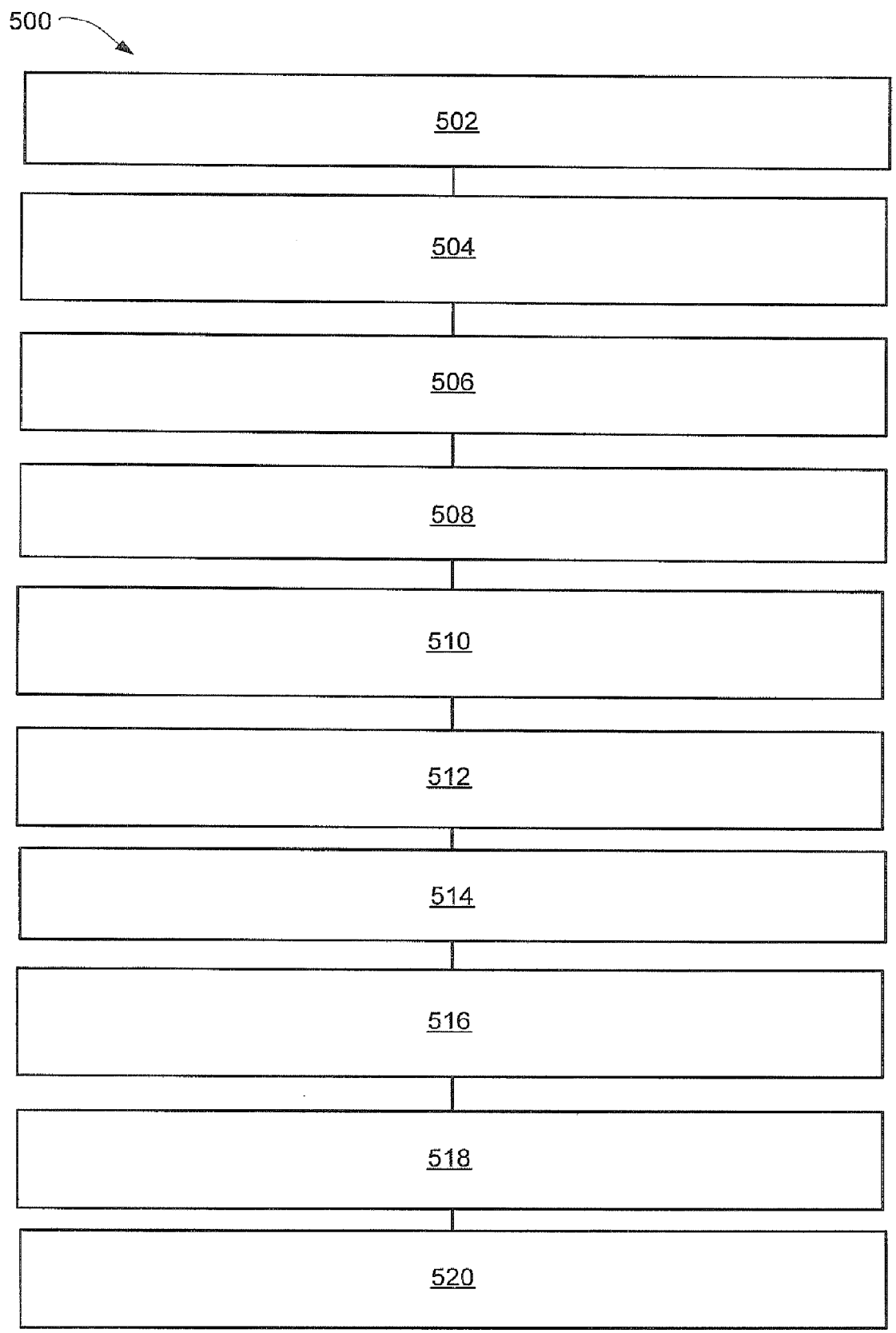
FIG. 5 is a flow chart of a system of the present invention.

Referring now to FIG. 5, therein is shown a flow chart of an integrated circuit system 500 of the present invention. The integrated circuit system 500 includes providing a semiconductor substrate having a semiconductor device provided thereon in a block 502; forming a first dielectric layer over the semiconductor substrate in a block 504; forming a first conductor core in the first dielectric layer in a block 506; forming a stop layer over the first conductor core in a block 508; forming a second dielectric layer over the stop layer in a block 510; forming a channel and a via in the second dielectric layer in a block 512; wet cleaning the channel and the via in the second dielectric layer in a block 514; depositing a barrier metal layer to line the channel and the via in the second dielectric layer in a block 516; selectively etching the barrier metal layer from the bottom of the opening in the dielectric layer in a block 518; and forming a second conductor core over the barrier metal layer to fill the second channel and the via to connect the second conductor core to the first conductor core in a block 520.

In various embodiments, the diffusion barrier layers are of at least one of tantalum (Ta), titanium (Ti), tungsten (W), tantalum nitride (TaN), titanium nitride (TiN), bi-layers thereof, alloys thereof, and compounds thereof. The seed layers (where used) are of materials of at least one of copper (Cu), gold (Au), silver (Ag), alloys thereof, and compounds thereof with one or more of the above elements. The conductor cores with or without seed layers are of conductor materials of at least one of as copper (Cu), aluminum (Al), gold, silver, alloys thereof, and compounds thereof.

The dielectric layers are of dielectric materials such as silicon oxide ($SiO_x$), tetraethylorthosilicate (TEOS), borophosphosilicate (BPSG) glass, etc. with dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), TMOS (tetramethylorthosi licate), OMCTS (octamethyleyclotetrasiloxane), HMDS (hexamethyidisiloxane), SOB (trimethylsilyl borate), DADBS (diacetoxyditertiarybutosiloxane), SOP (trimethylsilil phosphate), etc. with dielectric constants below 3.9 to 2.5. Ultra-low dielectric constant dielectric materials, having dielectric constants below 2.5 and which are available include commercially available Teflon-AF, Teflon microemulsion, polimide nanofoams, silica aerogels, silica xerogels, and mesoporous silica.

The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope and equivalents of the included claims. All matters hithertofore set forth or shown in the accompanying drawings are to be interpreted in an illustrative and non-limiting sense.

What is claimed is:

1. A method comprising:
   providing a semiconductor substrate having a semiconductor device provided thereon;
   forming a first dielectric layer over the semiconductor substrate;
   forming a first conductor core in the first dielectric layer;
   forming a stop layer over the first conductor core;
   forming a second dielectric layer over the stop layer;
   forming a channel and a via in the second dielectric layer and the via closed to the first conductor core;
   wet cleaning the channel and the via in the second dielectric layer;
   depositing a barrier metal layer in the channel and the via in the second dielectric layer;
   selectively etching the barrier metal layer and the stop layer from the bottom of the via in the dielectric layer; and
   forming a second conductor core over the barrier metal layer to fill the second channel and the via to connect the second conductor core to the first conductor core.

2. The method as claimed in claim 1 wherein depositing the second dielectric layer uses an ultra-low dielectric constant material.

3. The method as claimed in claim 1 wherein forming the first and second conductor cores deposits a material of at least one of copper, aluminum, gold, silver, compounds thereof, and combinations thereof.

4. The method as claimed in claim 1, further comprising:
forming a pore sealant over the sidewalls of channel and the via in the second dielectric layer.

5. The method as claimed in claim 1, wherein forming the second conductor core further comprises:
depositing a barrier metal flash layer over the barrier metal layer;
forming a metal seed layer over the barrier metal flash layer; and
forming a conductor metal over the metal seed layer.

6. The method as claimed in claim 1, wherein forming a channel and a via in the second dielectric layer uses a dual damascene process.

7. The method as claimed in claim 1, wherein wet cleaning the channel and the via is performed while the via is closed to contact with the first conductor core.

8. A method comprising:
providing a semiconductor substrate having a semiconductor device provided thereon;
forming a first dielectric layer over the semiconductor substrate;
forming a first conductor core in the first dielectric layer;
forming a stop layer over the first conductor core;
forming a second dielectric layer over the stop layer;
forming a channel and a via in the second dielectric layer and the via closed to the first conductor core;
wet cleaning the channel and the via in the second dielectric layer while the stop layer is present;
depositing a barrier metal layer to line the channel and the via in the second dielectric layer;
selectively etching the barrier metal layer and the stop layer from the bottom of the via in the dielectric layer only after wet cleaning the channel and the via;
then forming a second conductor core over the barrier metal layer to fill the second channel and the via to connect the second conductor core to the first conductor core.

9. The method as claimed in claim 8, wherein depositing the second dielectric layer uses an ultra-low dielectric constant material.

10. The method as claimed in claim 8, wherein forming the first and second conductor cores deposits a material of at least one of copper, aluminum, gold, silver, compounds thereof, and combinations thereof.

11. The method as claimed in claim 8, further comprising:
forming a pore sealant over the sidewalls of the channel and the via in the second dielectric layer.

12. The method as claimed in claim 8, wherein forming the second conductor core further comprises:
depositing a barrier metal flash layer over the barrier metal layer;
forming a metal seed layer over the barrier metal flash layer; and
forming a conductor metal over the metal seed layer.

13. The method as claimed in claim 8, wherein forming a channel and a via in the second dielectric layer uses a dual damascene process.

14. A method for reducing contaminants in a via connecting a first and a second conductor cores in an integrated circuit, comprising:
forming a stop layer over the first conductor core;
forming a dielectric layer over the stop layer;
forming the via in the dielectric layer and in the stop layer closed to the first conductor core;
wet cleaning the via in the presence of the stop layer;
depositing a barrier metal layer to line the via;
selectively etching the barrier metal layer and the stop layer from the bottom of the via in the dielectric layer after wet cleaning the via;
then forming a second conductor core over the barrier metal layer to fill the via to connect the second conductor core to the first conductor core.

15. The method as claimed in claim 14, wherein depositing the dielectric layer uses an ultra-low dielectric constant material.

16. The method for reducing contaminants as claimed in claim 14, wherein the first and second conductor cores comprise a material of at least one of copper, aluminum, gold, silver, compounds thereof, and combinations thereof.

17. The method for reducing contaminants as claimed in claim 14, further comprising:
forming a pore sealant over the sidewalls of the via.

18. The method for reducing contaminants as claimed in claim 14, further comprising:
depositing a barrier metal flash layer over the barrier metal layer;
forming a metal seed layer over the barrier metal flash layer; and
forming a conductor metal over the metal seed layer.

19. The method for reducing contaminants as claimed in claim 14, wherein wet cleaning the channel and the via is performed while the via is closed to contact with the first conductor core.

20. The method for reducing contaminants as claimed in claim 14, wherein forming the via in the dielectric layer uses a dual damascene process.

* * * * *